(12) United States Patent
Biloiu et al.

(10) Patent No.: US 10,395,969 B2
(45) Date of Patent: Aug. 27, 2019

(54) TRANSPARENT HALO FOR REDUCED PARTICLE GENERATION

(71) Applicant: Varian Semiconductor Equipment Associates, Inc., Gloucester, MA (US)

(72) Inventors: Costel Biloiu, Rockport, MA (US); Ernest Allen, Rockport, MA (US); Frank Sinclair, Boston, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 9 days.

(21) Appl. No.: 15/803,242

(22) Filed: Nov. 3, 2017

(65) Prior Publication Data
US 2019/0139774 A1    May 9, 2019

(51) Int. Cl.
*H01L 21/687* (2006.01)
*H01L 21/285* (2006.01)
(Continued)

(52) U.S. Cl.
CPC ........ *H01L 21/68785* (2013.01); *C23C 14/50* (2013.01); *C23C 16/4581* (2013.01); *C23C 16/4585* (2013.01); *H01J 37/32642* (2013.01); *H01J 37/32715* (2013.01); *H01L 21/265* (2013.01); *H01L 21/2855* (2013.01); *H01L 21/67069* (2013.01); *H01L 21/67207* (2013.01); *H01L 21/67213* (2013.01); *H01L 21/67346* (2013.01); *H01L 21/67353* (2013.01); *H01L 21/67383* (2013.01); *H01L 21/67386* (2013.01); *H01L 21/6831* (2013.01); *H01L 21/68721* (2013.01); *H01L 21/68735* (2013.01)

(58) Field of Classification Search
CPC .......... H01L 21/68735; H01L 21/6831; H01L 21/68721; H01L 21/67353; H01L 21/67346; H01L 21/67386; H01L 21/67069; H01L 21/67213; H01L 21/67207; H01L 21/265; H01L 21/2855; H01L 21/67383; H01L 21/68785; H01J 37/32715; H01J 37/32642; C23C 16/4585; C23C 16/4581; C23C 14/50
See application file for complete search history.

(56) References Cited

U.S. PATENT DOCUMENTS

| | | | |
|---|---|---|---|
| 2005/0000449 A1* | 1/2005 | Ishibashi | C23C 16/4585 118/728 |
| 2010/0107974 A1* | 5/2010 | Givens | H01L 21/67103 118/500 |

(Continued)

*Primary Examiner* — Bac H Au (57) ABSTRACT

Embodiments herein include a halo having varied conductance. In some embodiments, a halo surrounding a semiconductor workpiece may include a first side opposite a second side, and a first end opposite a second end, wherein the first side is operable to receive an ion beam from an ion source. The halo may further include a plurality of apertures extending between the first side and the second side, wherein the plurality of apertures permit passage of a portion of the ion beam to pass therethrough, and wherein the halo has a varied conductance between the first and second ends. In some embodiments, at least a group of apertures of the plurality of apertures vary in at least one of: pitch, and diameter. In some embodiments, a thickness of the halo between the first side and the second side varies along a height extending between the first end and the second end.

19 Claims, 10 Drawing Sheets

(51) Int. Cl.
 *H01L 21/265* (2006.01)
 *H01L 21/67* (2006.01)
 *H01L 21/673* (2006.01)
 *H01L 21/683* (2006.01)
 *C23C 14/50* (2006.01)
 *C23C 16/458* (2006.01)
 *H01J 37/32* (2006.01)

(56) References Cited

U.S. PATENT DOCUMENTS

2016/0281263 A1* 9/2016 Oki .................. C30B 25/08
2017/0098563 A1* 4/2017 Park ................ H01L 21/68735

* cited by examiner

TRANSPARENT HALO FOR REDUCED PARTICLE GENERATION

FIELD

Embodiments of the present disclosure relate to semiconductor workpiece processing and, more particularly, to semiconductor workpiece processing using a transparent halo for reduced particle generation.

BACKGROUND

For plasma aided semiconductor applications, especially patterning and etching, particle generation is detrimental because the particles may lead to interruption of the desired pattern and/or defect formation. In plasma processing apparatuses, particle formation is an inherent process. Sputtered material atoms generated by ion bombardment nucleate, then coagulate, and aggregate thus leading to particle formation. In these types of apparatuses, most of the sputtered material comes from a piece of hardware, the halo, surrounding the wafer. Therefore, reducing the amount of sputtered material from the halo to minimize particle defects is an on-going goal.

With respect to these and other considerations the present disclosure is provided.

BRIEF SUMMARY

In view of the foregoing, embodiments of the present disclosure provide an apparatus and transparent halo for reducing an amount of sputtered material to minimize particle defects impacting a workpiece.

In one embodiment according to the disclosure, an apparatus includes a platen for supporting a workpiece, and a halo surrounding the platen. The halo may include a first side opposite a second side, and a first end opposite a second end, wherein the first side is operable to receive an ion beam from an ion source. The halo may further include a plurality of apertures extending between the first side and the second side, wherein the plurality of apertures permit passage of a portion of the ion beam to pass therethrough, and wherein the halo has a varied conductance between the first and second ends.

In another embodiment according to the disclosure, a halo surrounding a semiconductor workpiece includes a first side opposite a second side, and a first end opposite a second end, wherein the first side is operable to receive an ion beam from an ion source. The halo further includes a plurality of apertures extending between the first side and the second side, wherein the plurality of apertures permit passage of a portion of the ion beam to pass therethrough, and wherein the halo has a varied conductance between the first and second ends.

In yet another embodiment according to the disclosure, an apparatus includes a platen for supporting a workpiece, and a transparent halo surrounding the platen. The transparent halo may include a first side opposite a second side, and a first end opposite a second end, wherein the first side is arranged to receive an ion beam from an ion source. The transparent halo may further include a plurality of apertures extending between the first side and the second side, wherein the plurality of apertures permit passage of a just a portion of the ion beam to pass therethrough, and wherein the transparent halo has a varied conductance between the first and second ends by varying at least one of the following: a diameter of a group of apertures from the plurality of apertures, and a thickness of the halo between the first side and the second side.

BRIEF DESCRIPTION OF THE DRAWINGS

The accompanying drawings illustrate example approaches of the disclosure, including the practical application of the principles thereof, as follows.

The drawings are not necessarily to scale. The drawings are merely representations, not intended to portray specific parameters of the disclosure. The drawings are intended to depict example embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, various embodiments herein have been described in the context of one or more elements or components. An element or component may comprise any structure arranged to perform certain operations. Although an embodiment may be described with a limited number of elements in a certain topology by way of example, the embodiment may include more or less elements in alternate topologies as desired for a given implementation. Note any reference to "one embodiment" or "an embodiment" means a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

Analysis of the particles' composition show the particles may contain halo material, for example, as a result of the ion bombardment process. Therefore, an approach to reduce particle generation is to reduce the amount of sputtered material from the halo surrounding the wafer. In some embodiments, providing a transparent halo ensures uniform electrostatic field in an extraction gap and constant pressure as the halo-wafer system is scanned in front of the extraction optics. The transparent halo allows reduction of the amount of sputtered material by reducing the ribbon ion beam-halo interaction cross-section. In addition, the transparent halo will increase vacuum conductance. As a result, a larger flow rate may be necessary to maintain the process pressure, wherein a larger flow rate translates in shorter residence time and implicitly lower particle nucleation probability.

In some embodiments, an apparatus includes a platen configured to hold a workpiece, and a halo surrounding the platen. The halo may include a first side opposite a second side, and a first end opposite a second end, wherein the first side is operable to receive an ion beam. The halo may further include a plurality of apertures extending between the first side and the second side, wherein the plurality of apertures permit passage of just a portion of the ion beam to pass therethrough. The halo may have variable conductance between the first and second ends by either varying the dimensions of a group of apertures of the plurality of apertures to vary halo transparency, or by varying a thickness of the halo between the first and second sides. In some embodiments, the group of apertures is located in a central area of the halo, for example, around the platen and workpiece.

Figure 1:
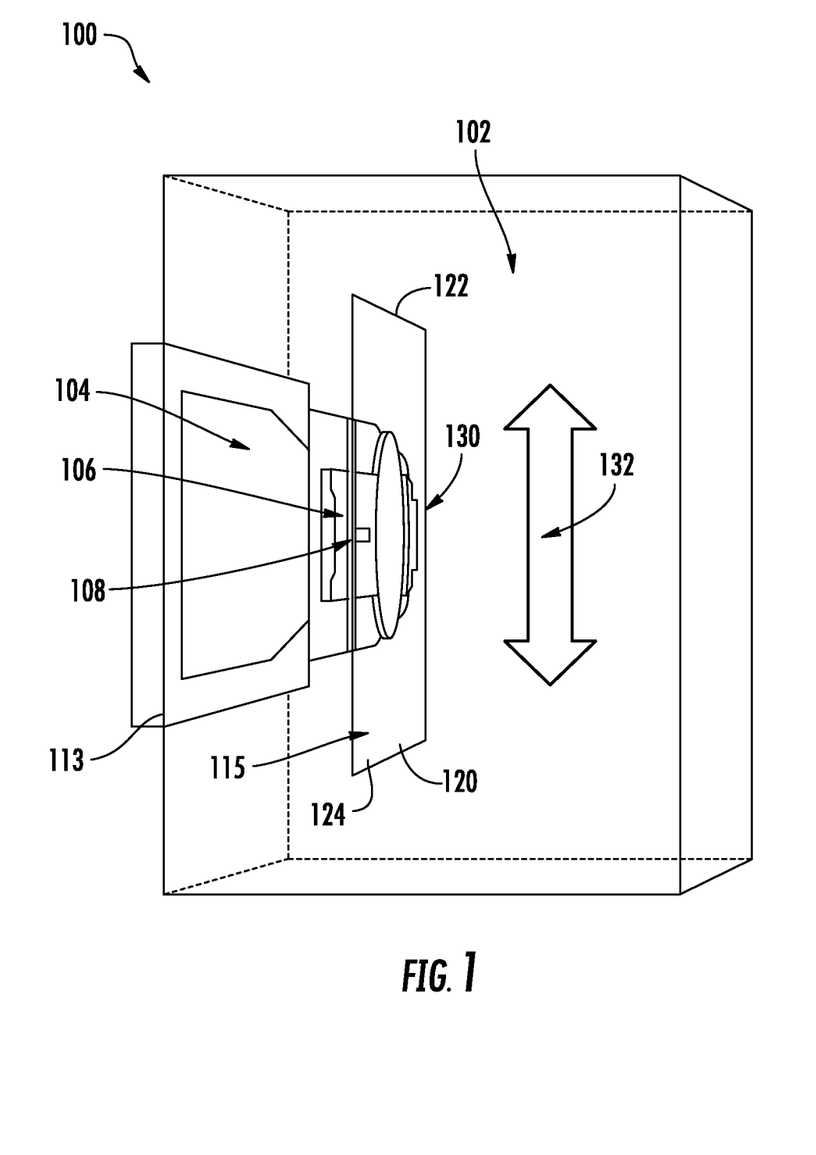
FIG. 1 is a schematic view illustrating an ion implantation system in accordance with embodiments of the present disclosure.
Figure 2:
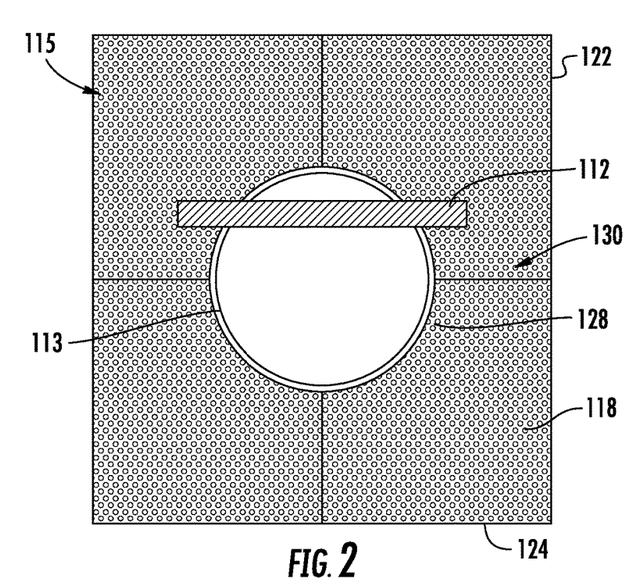
FIG. 2 is a front view of a transparent halo and wafer implanted by an ion beam in accordance with embodiments of the present disclosure.

Referring now to FIGS. 1-2, an example apparatus 100 used for processing a semiconductor workpiece using a transparent halo for reduced particle generation according to embodiments of the disclosure will be described in greater detail. As shown, the apparatus may include a processing chamber 102 encasing a portion of an ion source 104 having an extraction plate 106 and an extraction slit 108. The ion source 104 generates an ion beam 112 directed toward a workpiece 113, such as a wafer mounted on a platen, so the ion beam 112 extends across the workpiece 113, forming a geometric line referred to as a chord. The ion beam 112 may be a ribbon ion beam, having a length much greater than a width. For example, the length of the ion beam 112 may be several hundred millimeters, while the width of the ion beam 112 may be approximately ten millimeters. The ion beam 112 may be straight along the length direction. Alternatively, other dimensions may also be used and are within the scope of the disclosure.

The apparatus may further include a halo 115 surrounding the workpiece 113. The halo 115 may include a first side 118 facing the ion source 104, and a second side 120 opposite the first side 118. The halo 115 may further include a first end (e.g., upper end) 122 and a second end (e.g., bottom end) 124. Between the first end 122 and the second end 124 is a central opening 128 located in a central area 130 of the halo 115. The halo 115 further includes a plurality of apertures 135 extending through the first side 118 and the second side 120. As will be explained in greater detail below, during use, the plurality of apertures 135 permit passage of a portion of the ion beam 112 through the halo 115.

The halo 115 is designed to ensure a uniform electrostatic field in the extraction gap as the workpiece 113 is passed in front of the extraction slit 108, for example, in the direction shown by arrow 132. Uniform field is necessary because the workpiece 113 may be processed with beams of constant current and constant angular distribution all over a surface of the workpiece 113. In some embodiments, vacuum pumping is accomplished through the extraction slit 108, wherein a working gas is introduced in an upstream plasma chamber (not shown), and turbo pumps are located in the processing chamber 102. Given the circular shape of the workpiece 113, vacuum conductance will vary as the workpiece 113 is scanned up and down along arrow 132 in front of the extraction slit 108. The halo 115 is provided to ensure constancy of the vacuum conductance during processing (e.g., during scanning).

In some embodiments, ion extraction takes place by having the ion source 104 at ground potential and biasing the halo 115 at negative potential equal with the desired energy of the extracted ion. For this reason, the halo 115 may be made of electrically conducting material so the halo 115 can be negatively biased and provide a uniform electrostatic field in the extraction gap. The presence of the plurality of apertures 135 may alter electrostatic field distribution, thus affecting the uniformity of extracted ion beam current and ion angular distribution. For example, results of an OPERA model run for usual operating conditions, e.g., 10 mm z gap and 1 kV extraction voltage, and for holes having 10 mm pitch and 8 mm diameter, may demonstrate for very close to the ion source, e.g., at z=1 mm, equipotential lines are not perturbed. The result means the plasma inside the ion source 104 does not "see" the plurality of apertures 135 in the halo 115. Going closer to the wafer, an electrostatic signature of the plurality of apertures 135 starts to appear in the equipotential lines distribution. Altered potential is beyond the wafer edge, and thus does not affect ion beam characteristics.

Figure 3A:
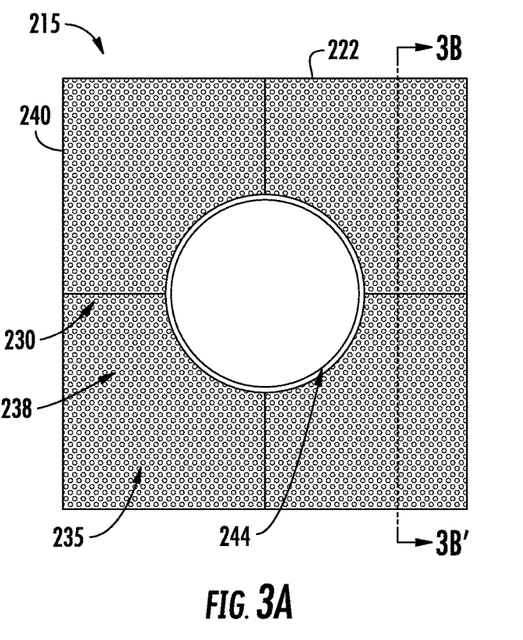
FIG. 3A is a front view of the transparent halo of FIG. 2 in accordance with embodiments of the present disclosure.
Figure 3B:
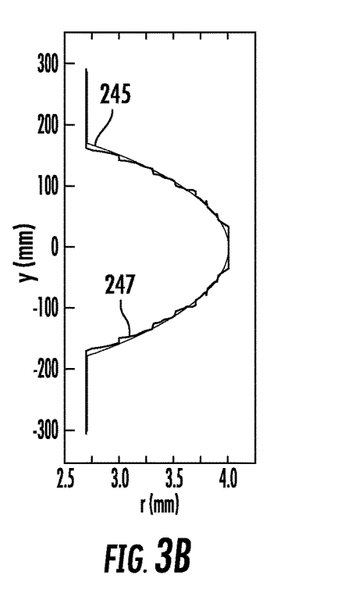
FIG. 3B illustrates a vertical size distribution of the apertures in the B-B' cross-section of the transparent halo of FIG. 3A in accordance with embodiments of the present disclosure.

Turning now to FIGS. 3A-B, an example halo 215 according to embodiments of the present disclosure will be described in greater detail. In FIG. 3A, the halo 215 includes a first side 218 opposite a second side (not shown), and a first end (e.g., upper end) 222 and a second end (e.g., bottom end) 224. Between the first end 222 and the second end 224 is a central opening 228 located in a central area 230 of the halo 215. The halo 215 further includes a plurality of apertures 235 extending from the first side 218 to the second side. By virtue of the presence of the plurality of apertures 235, the halo 215 is considered to be transparent. Said differently, the halo 215 is transparent because the halo 215 permits a portion of the ion beam to pass therethrough, thus reducing ion induced halo particle generation.

In this embodiment, the halo 215 includes a group of apertures 238 from the plurality of apertures 235 having different dimensions. For example, the group of apertures 238 located in the central area 230 of the halo 215 may vary in pitch and/or diameter relative to the remainder of the plurality of apertures 235. More specifically, apertures of decreasing radius from the central area 230 of the halo 215 towards the first end 222 and the second end 224, respectively, provide a gradual transparency to compensate for the wafer presence. In some embodiments, there may be no variation in aperture dimensions between a third end 240 and a fourth end 241.

To prevent electrostatic field alteration at the wafer edge, the halo 215 may include an aperture-free annular region 244, such as a 10 mm opaque band encircling the central opening 228 to virtually extend the edge of the workpiece so the presence of the plurality of apertures 235 does not impact the uniformity of the electrostatic field and ultimately the workpiece. One will appreciate, given drilling tool size availability, diameter variation is limited. For example, as shown in FIG. 3B, diameter (r) of the group of apertures 238 cannot have a continuous variation between the first end 222 and the second end 224, as represented by line 245, and instead takes on a discrete distribution, as represented by line 247. In one non-limiting example, the plurality of apertures 235 may have a pitch of 10 mm, and diameters from 8 to 5 mm, wherein the group of apertures 238 in the central area 230 have diameters of 8 mm, and those apertures proximate the first end 222 and the second end 224 have diameters of 5 mm. As configured, the halo 215 may have an overall ion beam transmission of approximately 23%. One will appreciate, the specific dimensions of the plurality of apertures 235 are non-limiting and are just provided for illustrative purposes.

Figure 4A:
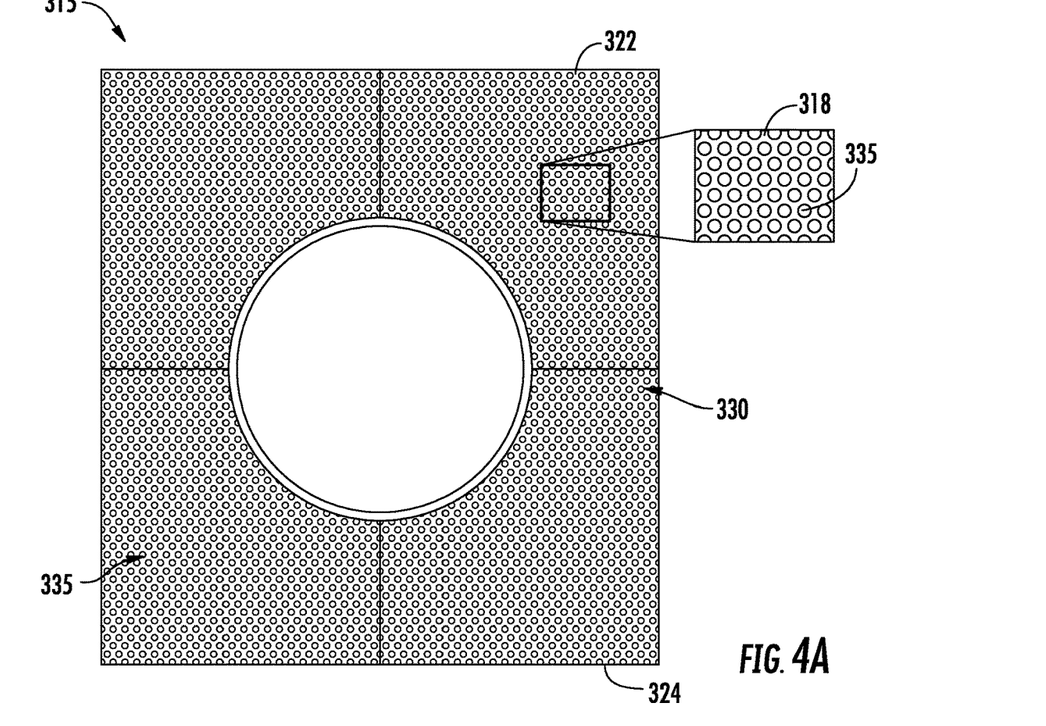
FIGS. 4A-B illustrate dimensions of the apertures of the transparent halo of FIG. 2 in accordance with embodiments of the present disclosure.
Figure 4B:
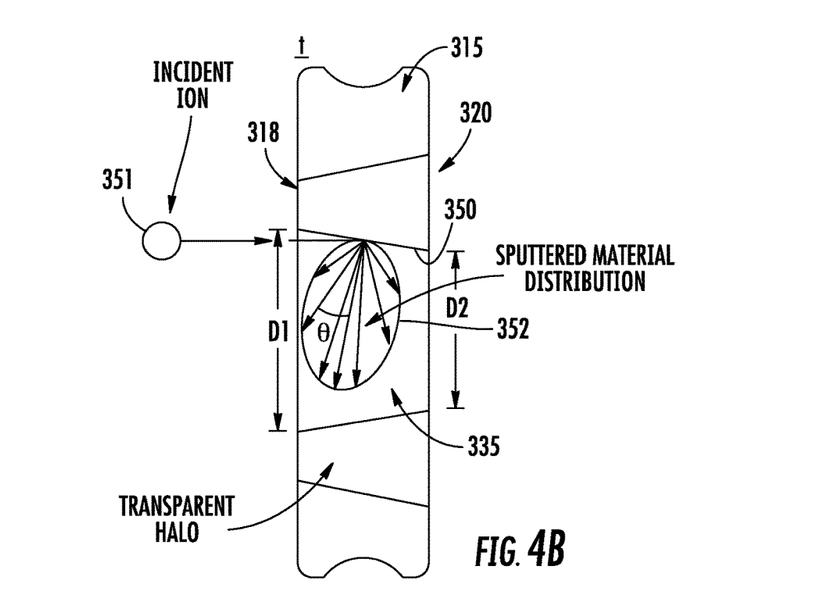

Turning now to FIGS. 4A-B, a halo 315 according to another embodiment of the present disclosure will be described in greater detail. The halo 315 may be the same or similar to the halo 115 and the halo 215 described above. As such, certain aspects of the halo 315 may be omitted for the sake of brevity. As shown, the halo 315 includes a plurality of apertures 335 extending through a thickness of the halo 315, for example, between first and second sides 318, 320. A subset of the plurality of apertures 335 may have different dimensions. More specifically, the halo 315 may include apertures of decreasing radius from the central area 330 of the halo 315 towards the first end 322 and the second end 324.

In this embodiment, as best shown in FIG. 4B, a first diameter 'D1' of each of the plurality of apertures 335 along the first side 318 of the halo 315 is larger/longer than a second diameter 'D2' of each of the plurality of apertures 335 along the second side 320 of the halo 315. Providing apertures with a larger diameter on the first side 318, facing the extraction optics, and a smaller diameter on the second side 320, does not affect overall conductance. Advantageously, providing apertures with a larger diameter on the first side 318 reduces the halo-beam interaction area and, implicitly, the amount of resultant sputtered material. Although some incident ions 351 may strike the sidewalls 350 of the plurality of apertures 335, given the Lambertian distribution of the sputtered atoms, part of the sputtered material 352 will pass through the aperture 335, and subsequently pumped away.

Figure 5A:
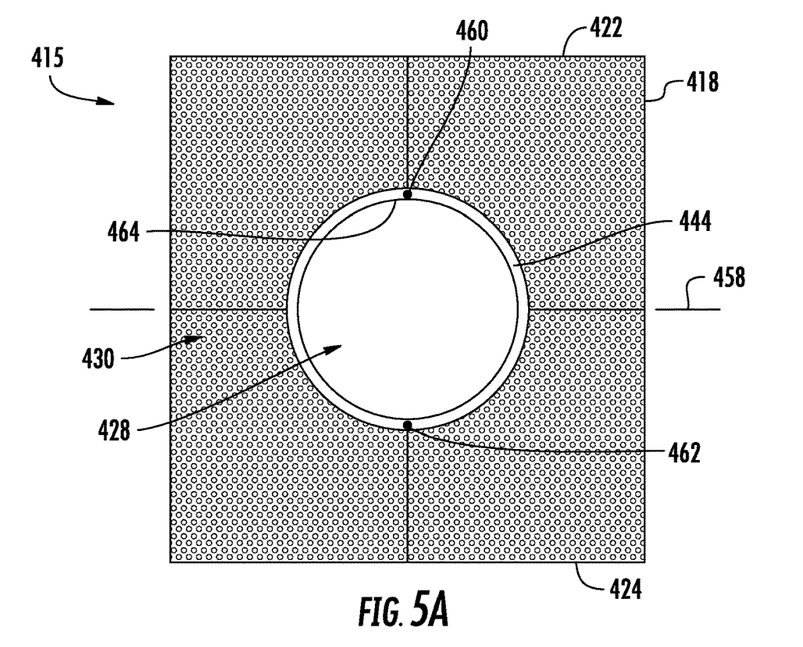
FIGS. 5A-B illustrate another transparent halo in accordance with embodiments of the present disclosure.
Figure 5B:
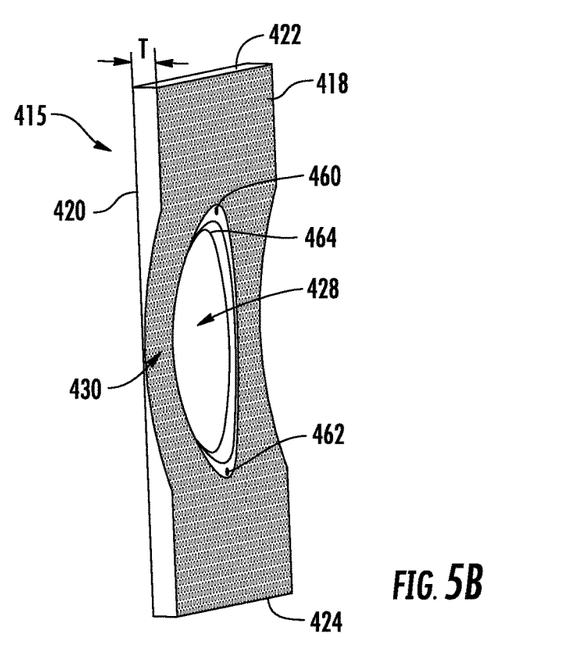

Turning now to FIGS. 5A-B, a halo 415 according to another embodiment of the present disclosure will be described in greater detail. The halo 415 may share similar features to halos 115, 215, and 315, described above. As such, certain aspects of the halo 415 may be omitted for the sake of brevity. As shown, a thickness 'T' of the halo 415 between the first side 418 and the second side 420 varies between the first end 422 and the second end 424. In some embodiments, the thickness of the halo 415 in the central area 430 is less than a thickness of the halo 415 proximate the first and second ends 422, 424. The halo 415 may have a constant thickness above an upper point 460 of the central opening 428 and below a lower point 462 of the central opening 428. Furthermore, as shown, thickness 'T' of the halo 415 in the central area 430 may be sloped or curved with decreasing thickness towards a midline 458 of the halo 415.

In some embodiments, the halo 415 may have a uniform transparency, wherein the plurality of apertures 435 all have the same diameter, yet the thickness of the halo 415 varies between first and second ends 422, 424. Vacuum conductance of an aperture of length 1 and diameter d may be given by [1]:

$$C = p \frac{v_{th}}{4} \cdot \frac{\pi d^2}{4}$$

where vth is the thermal velocity of the atom or molecule and p is the transmission probability, the latter being a function of the aperture length to the aperture diameter ratio. For a constant aperture diameter, the probability p decreases exponentially with the length of the aperture. As such, the thickness of the halo 415 varies according to a function, such as a convolution of the circular wafer opacity and the exponential decay of the vacuum transmission p. For the halo 415 shown in FIGS. 5A-B, including apertures of 10 mm pitch and 8 mm diameter, the thickness 'T' may vary from 5 mm along the midline 458 to 30 mm at an edge 464 of the central opening 428. Beyond the upper point 460 and the lower point 462 of the central opening 428 the thickness 'T' may be constant, e.g., 40 mm.

Figure 6:
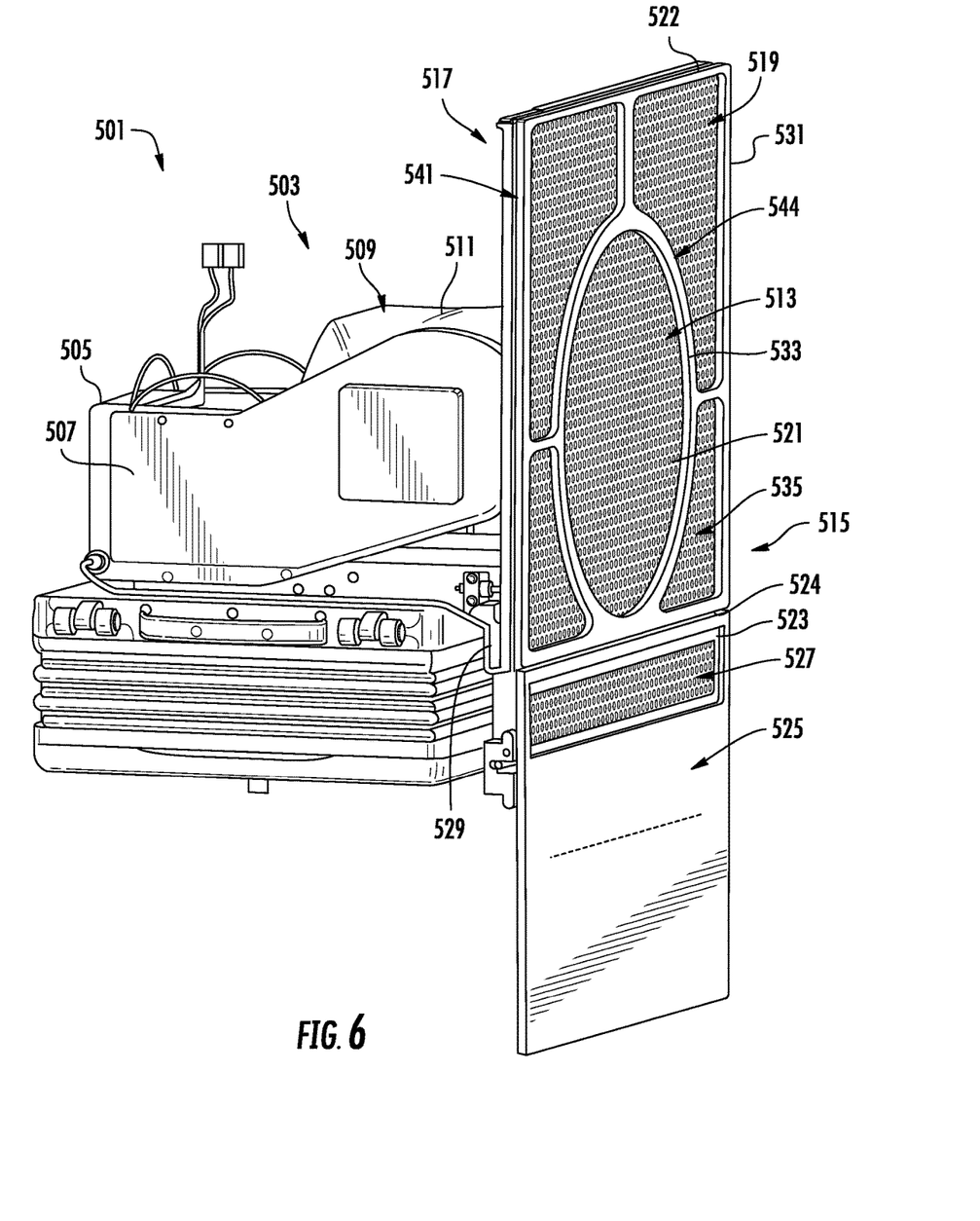
FIG. 6 illustrates an assembly for processing a semiconductor workpiece using a transparent halo for reduced particle generation according to embodiments of the disclosure.
Figure 7:
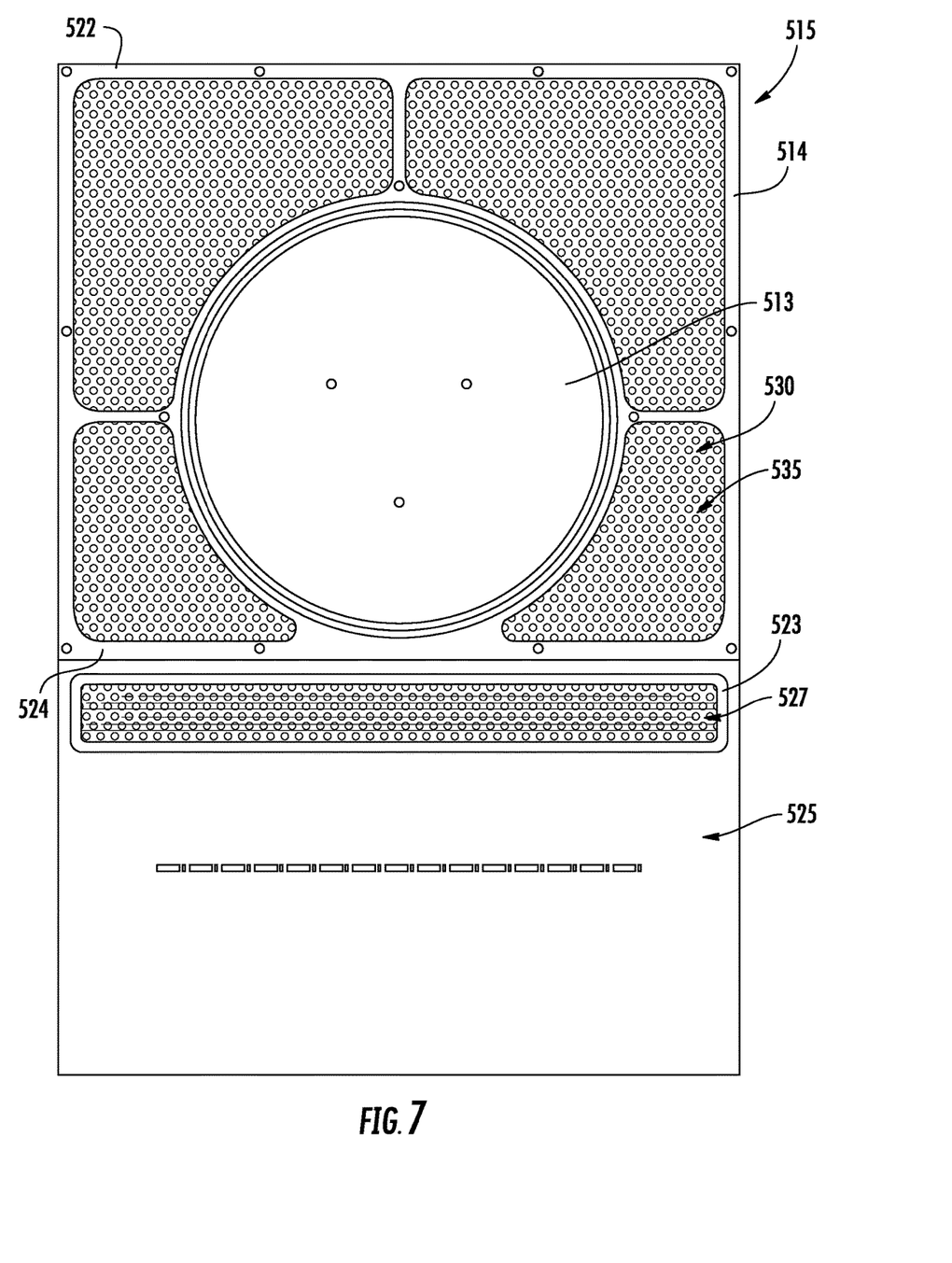
FIGS. 7-8 illustrate a transparent halo assembly in accordance with embodiments of the present disclosure.

Turning now to FIGS. 6-7, an assembly 501 for processing a semiconductor workpiece using a transparent halo for reduced particle generation according to embodiments of the disclosure will be described in greater detail. As shown, the assembly 501 includes a roplat 503 including a base 505 coupled to two outwardly extending side arms 507, spaced apart from one another. A rotatable assembly 509 is disposed in the space between the side arms 507 and is rotatably attached to the side arms 507. More specifically, a center block 511 of the rotatable assembly 509 is coupled between the side arms 507. A platen 513 is provided to hold a workpiece (not shown), the platen 513 being coupled to the center block 511 by a mounting assembly 517. In some embodiments, the platen 513 may be an electrostatic chuck, capable of clamping a workpiece in place through the use of electrostatic force. A first motor (not shown) may be disposed within the rotatable assembly 509 to allow the platen 513 to rotate/spin around a first axis perpendicular to the plane of the platen 513 and passing through the center of the platen 513.

A second motor (not shown) may be disposed within the roplat 503, such as within the center block 511 or within the side arms 507. The second motor allows rotation of the rotatable assembly 509 around a second axis horizontal to the plane of the platen 513, and oriented perpendicular to the first axis. The rotatable assembly 509 may be capable of at least 90° of rotation. For example, the roplat 503 has a first position (not shown) known as the load/unload position, where the rotatable assembly 509 is oriented so the platen 513 is horizontal or approximately horizontal. While in this load/unload position, the workpiece may be placed on the platen 513, and, after processing, subsequently may be removed from the platen 513.

The roplat 503 also has a second position, shown in FIGS. 6-7, known as the operational position, where the rotatable assembly 509 is oriented so the platen 513 is vertical or approximately vertical. In this operational position, the platen 513 and the clamped workpiece are facing the ion beam being directed toward the platen 513. In other words, a plane formed by a surface 521 of the platen 513 is perpendicular to the ion beam when the roplat 503 is in the position shown in FIGS. 6-7.

As further shown, the platen 513 may be surrounded by a halo assembly 515 including a first halo 519 having a plurality of apertures 535 formed therein. The halo assembly 515 may further include a second halo 523 positioned below the first halo 519. In some embodiments, the second halo 523 is part of, or may be coupled to, a lower halo plate 525 mechanically coupled to the roplat 503 by a bracket 529. During loading/unloading of the platen 513, the lower halo plate 525 may maintain the constant or fixed position illustrated in FIGS. 6-7. The second halo 523 may be positioned in a turn-around area of the ion beam scan. As shown, the lower halo plate 525 and the second halo 523 may be generally planar with the first halo 519 and the platen 513.

The second halo 523 may include a plurality of apertures 527 provided therein, thereby making the second halo 523 transparent. In some embodiments, the first halo 519 and the second halo 523 have a same or similar transparency by providing apertures of a same size and pitch. In other embodiments, the first halo 519 and the second halo 523 have a dissimilar transparency, meaning the size and pitch of the plurality of apertures 535 and the plurality of apertures 527 are different. Furthermore, of the first halo 519 and the second halo 523 may have variable transparency. For example, a subset of the plurality of apertures 535 may have different dimensions, such as decreasing radius from the central area 530 of the first halo 519 towards the first end 522 and the second end 524.

In some embodiments, a first diameter of all of the plurality of apertures 535 of the first halo 519 and all of the plurality of apertures 527 of the second halo 523 along a first side, such as the side of the assembly 501 facing the ion source, is larger/longer than a second diameter of the plurality of apertures 535, 527 along a second side facing away from the ion source. In still other embodiments, a thickness of the first halo 519 and/or the second halo 523 may vary. For example, the thickness of the first halo 519 in the central area 530 may be less than a thickness of the first halo 519 proximate the first and second ends 522, 524. In some embodiments, the first halo 519 may have a constant thickness in areas above and below the platen 513.

As shown, the first halo 519 may include a frame 531 extending around a perimeter thereof. The frame 531 may be directly coupled to the mounting assembly 517 via any number and variety of mechanical fasteners. An inner section 533 of the frame 531 surrounds the platen 513, and may represent an aperture-free annular region 544. In between individual elements of the frame 531, the first halo 519 may include one or more regions of conductive mesh made from aluminum or similarly electrically conductive alloy.

Figure 8:
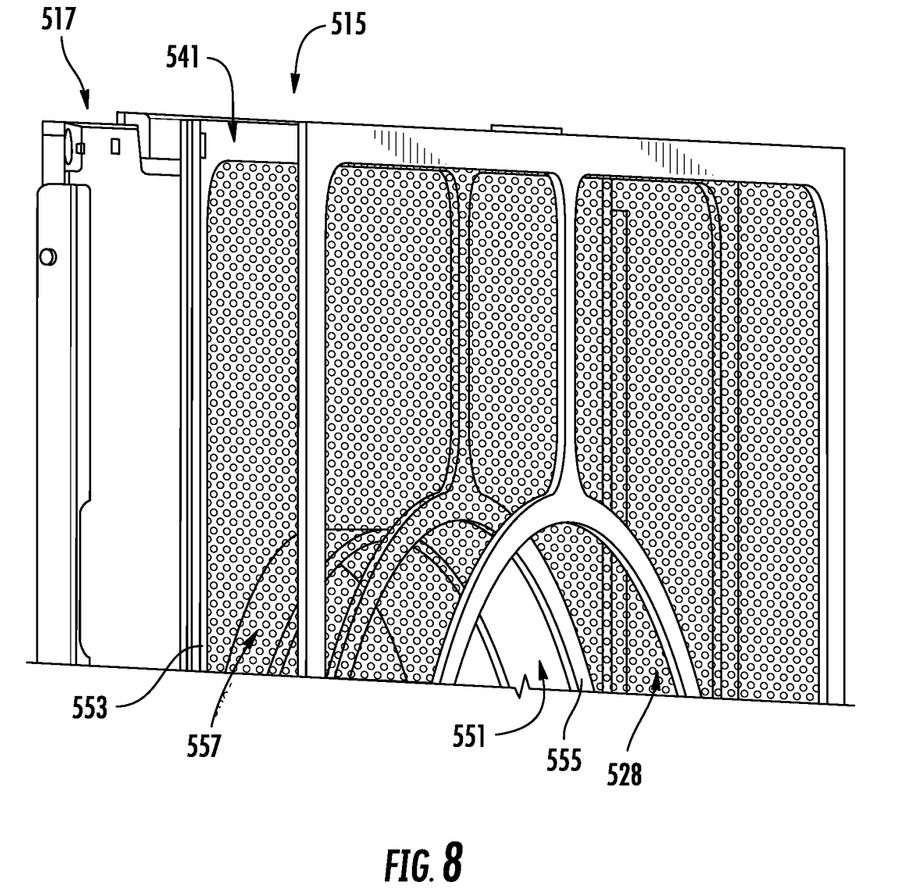

As shown in FIG. 8, the halo assembly 515 may further include a third halo 541 positioned between the first halo 519 and the mounting assembly 517. The third halo 541 may include the same or approximately the same features as the first halo 519. In some embodiments, the third halo 541 differs from the first halo 519 because the plurality of apertures 557 of the third halo 541 may be dimensioned differently than the plurality of apertures 535 of the first halo 519. For example, the plurality of apertures 557 of the third halo 541 may have a smaller diameter than the plurality of apertures 535 of the first halo 519.

As further shown, the third halo 541 includes a central opening 551 substantially aligned with the central opening 528 of the first halo 519. The central opening 551 of the third halo 541 is sized and positioned to permit the platen 513 to extend therethrough. The third halo 541 may further include a frame 553 extending around a perimeter thereof. The frame 553 may be directly coupled to the mounting assembly 517 via any number and variety of mechanical fasteners. An inner section 555 of the frame 553 is configured to surround the platen 513 (FIGS. 6-7), and may represent an aperture-free annular region of the third halo 541. The first halo 519 may include one or more regions of conductive mesh (e.g., Al) defined by the elements of the frame 553. In some embodiments, the third halo 541 may be at ground potential, while the first halo 519 is at negative potential. When the wafer is biased, better results are achieved when the halo is an extension of the wafer. Therefore, in some embodiments, the third halo 541 may be at the same potential as the wafer or ground.

Figure 9:
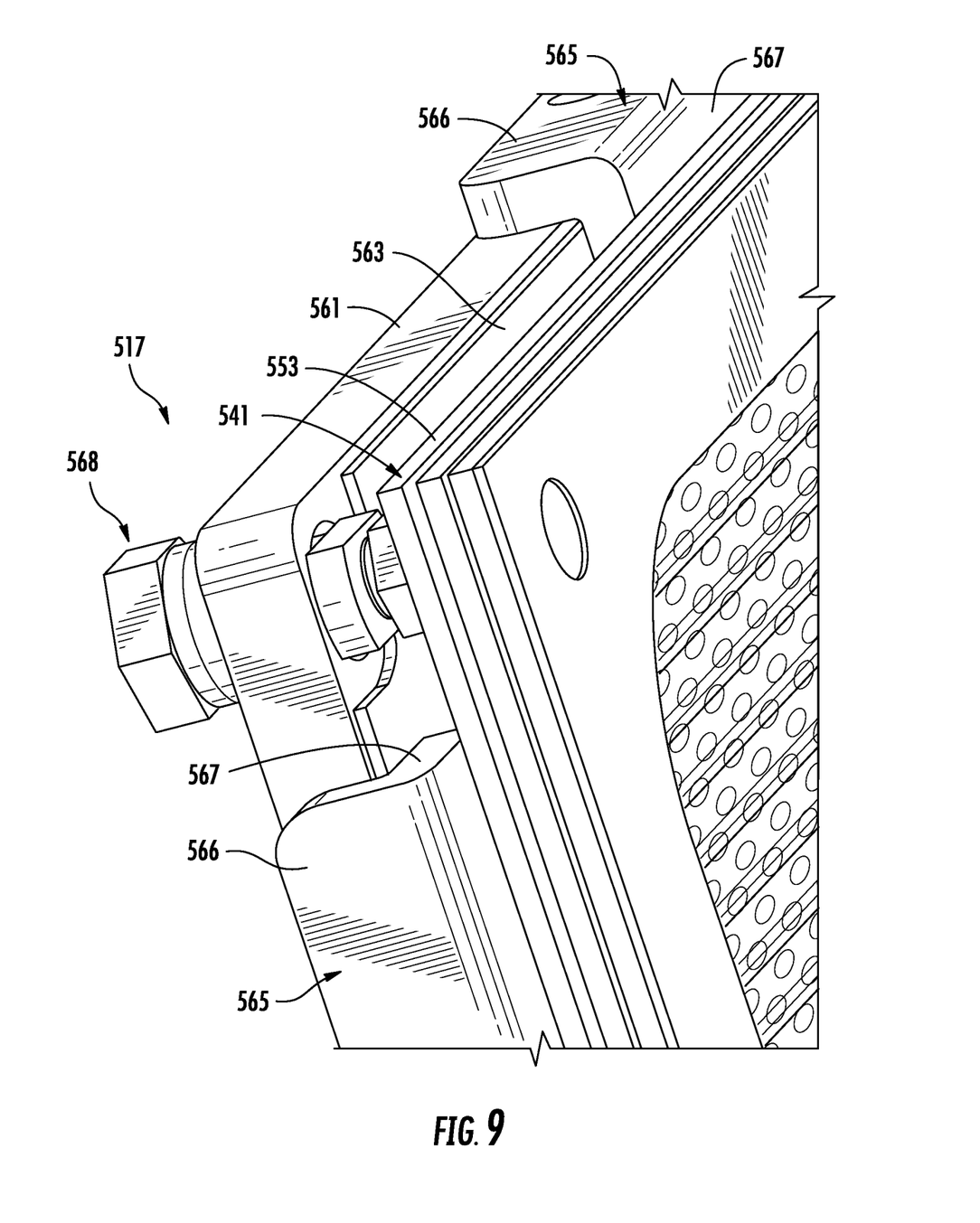
FIGS. 9-10 illustrate a mounting assembly for the transparent halo assembly in accordance with embodiments of the present disclosure.
Figure 10:
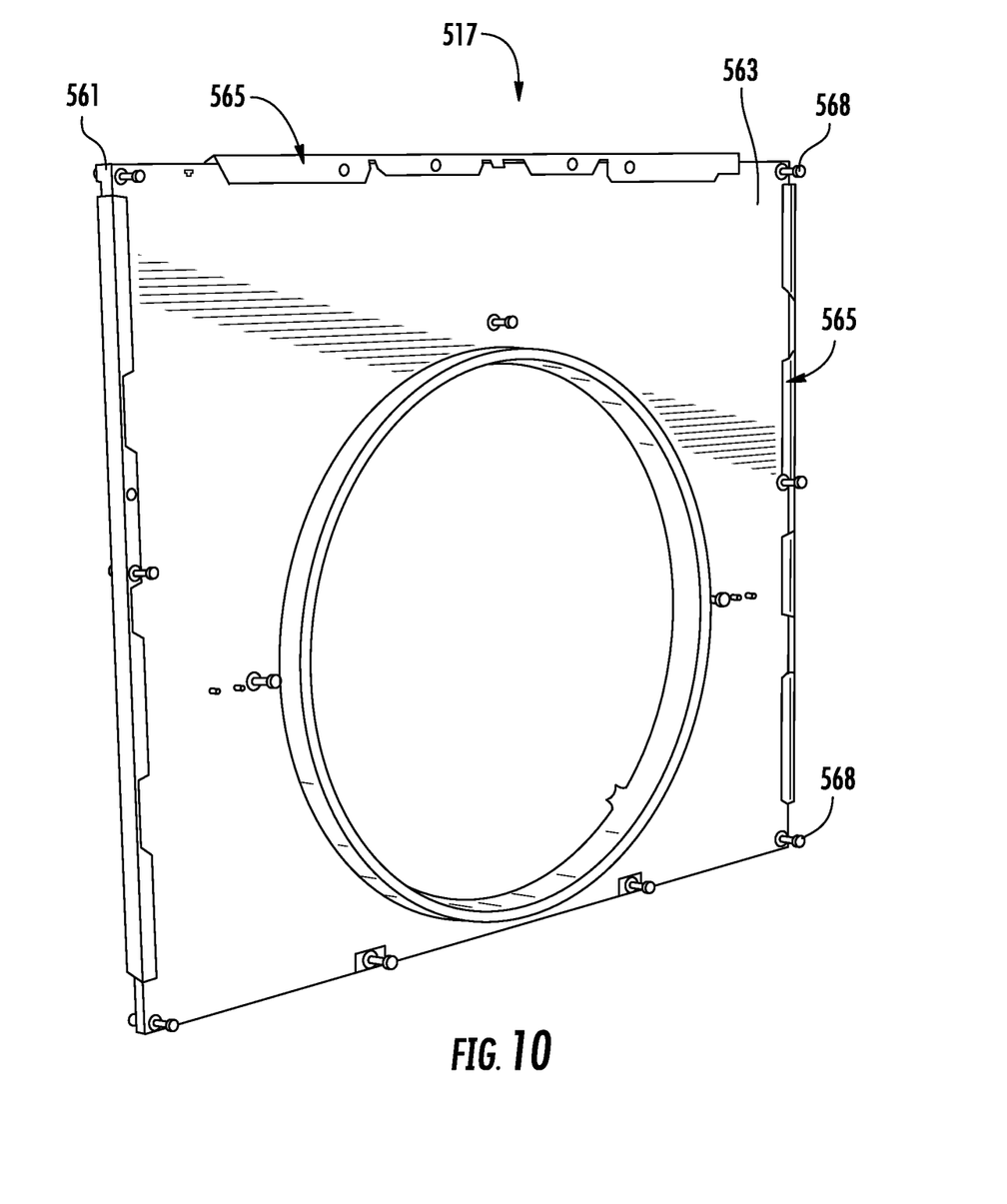

Turning now to FIGS. 9-10, securement of the first halo 519 and the third halo 541 to the mounting assembly 517 according to embodiments of the present disclosure will be described in greater detail. As shown, the mounting assembly 517 may include a halo support frame 561 having a beam dump 563. A plurality of cradles 565 may be provided for coupling the beam dump 563 to the halo support frame 561. In some embodiments, the cradles 565 may be generally L-shaped, with a first section 566 coupled to the halo support frame 561 and a second section 567 extending over/along the beam dump 563. As further shown, the mounting assembly 517 may further include a plurality of mechanical fasteners 568 extending through the halo support frame 561 and coupled to the first halo 519 and to the third halo 541. The mechanical fasteners 568 enable the mounting assembly 517, the first halo 519, and the third halo 541 to move together with the roplat.

Figure 11:
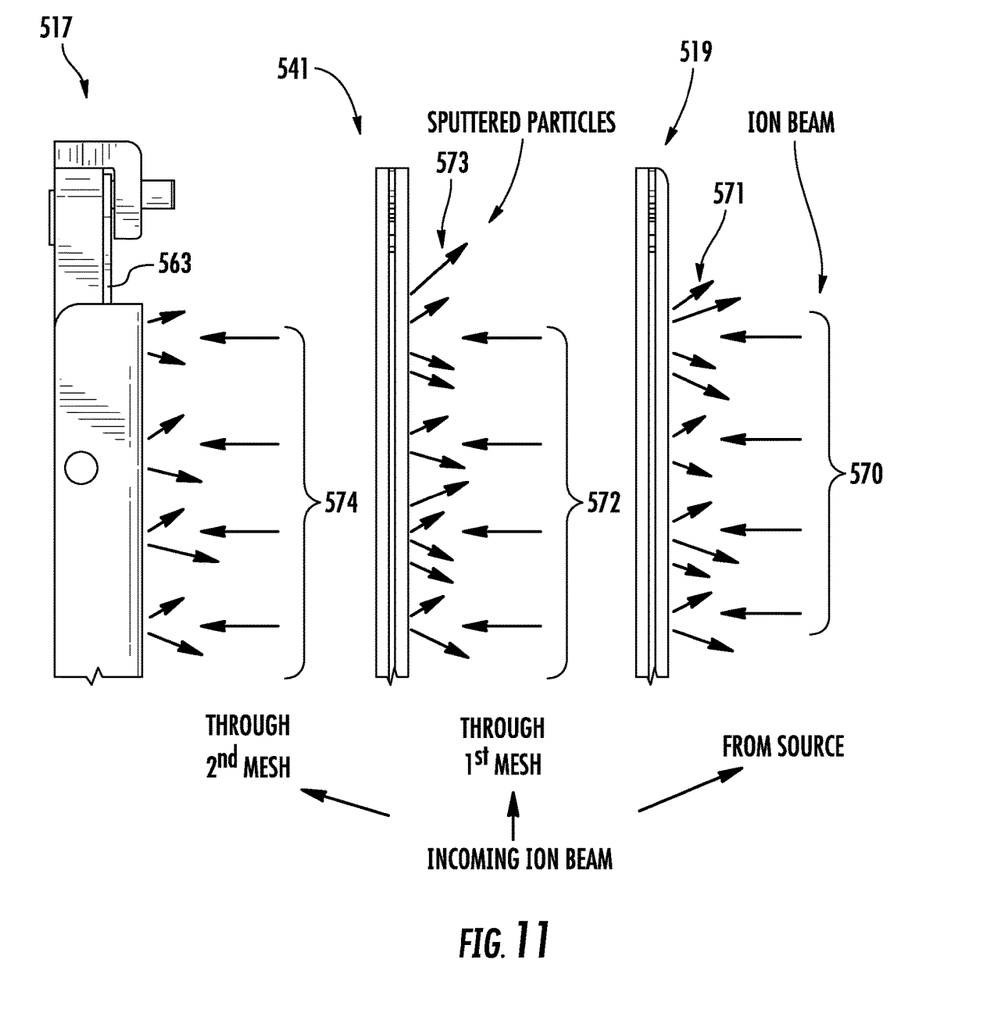
FIG. 11 illustrates operation of the halo assembly and the mounting assembly of FIGS. 9-10 according to embodiments of the present disclosure.

Turning now to FIG. 11, operation of the halo assembly 515 and the mounting assembly 517 according to embodiments of the present disclosure will be described in greater detail. As shown, the first halo 519 is positioned to receive an ion beam 570 from an ion source (not shown). A first portion 571 of the ion beam 570 may impact the first side 518 of the first halo 519, and bounce or deflect back towards the ion source. A second portion 572 of the ion beam 570 may pass through the first halo 519, for example, through the plurality of apertures 535 formed therethrough. The second portion 572 of the ion beam 570 may then be received by the third halo 541, where a third portion 573 of the ion beam 570 is redirected backward towards the first halo 519. A fourth portion 574 of the ion beam 570 may pass through the third halo 541, for example, through the plurality of apertures 557 formed therethrough. The fourth portion 574 may then continue towards the mounting assembly 517, until impact is made with the beam dump 563. In some embodiment, the particles ejected, bounced, or sputtered back towards the ion source are removed, for example, by vacuum pumping.

In summation, embodiments described herein provide at least the following technical advantages. Firstly, the transparency of the halo reduces the interaction cross-section area between the ribbon beam and the halo. As a result, the amount of sputtered material and implicitly particle formation is reduced. Secondly the halo may increase vacuum conductance, reducing the residence time, and translating to shorter time spent by an atom in the extraction area and therefore lower particle nucleation probability and overall reduced particle generation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus comprising:
    a platen for supporting a workpiece; and
    a halo surrounding the platen, the halo comprising:
        a first side opposite a second side, and a first end opposite a second end, wherein the first side is operable to receive an ion beam from an ion source; and
        a plurality of apertures extending between the first side and the second side, wherein the plurality of apertures permit passage of a portion of the ion beam to pass therethrough, and
        wherein a first group of apertures of the plurality of apertures has a first diameter, the first group of apertures positioned along a midpoint between the first and second ends, wherein a second group of apertures of the plurality of apertures has a second diameter, the second group of apertures positioned along at least one of: the first end, and the second end, and wherein the first diameter is greater than the second diameter.

2. The apparatus of claim 1, wherein the first and second groups of apertures vary in pitch.

3. The apparatus of claim 2, wherein the first group of apertures is located in a central area of the halo.

4. The apparatus of claim 1, wherein the first side is substantially perpendicular to the ion beam.

5. The apparatus of claim 1, wherein a diameter of each of the plurality of apertures along the first side of the halo is larger than a diameter of each of the plurality apertures along the second side of the halo.

6. The apparatus of claim 1, the halo further comprising an aperture-free annular region defining a central opening surrounding the platen.

7. The apparatus of claim 1, wherein a thickness of the halo between the first side and the second side varies between the first end and the second end.

8. The apparatus of claim 7, wherein the thickness of the halo in a central area is less than a thickness of the halo proximate the first and second ends.

9. The apparatus of claim 1, wherein the halo is electrically conductive.

10. The apparatus of claim 1, further comprising a roplat including a rotatable assembly, wherein the platen is coupled to the rotatable assembly.

11. A halo surrounding a semiconductor workpiece, the halo comprising:
    a first side opposite a second side, and a first end opposite a second end, wherein the first side is operable to receive an ion beam from an ion source; and
    a plurality of apertures extending between the first side and the second side, wherein the plurality of apertures permit passage of a portion of the ion beam to pass therethrough, and
    wherein a thickness between the first side and the second side varies along a height extending between the first end and the second end.

12. The halo of claim 11, wherein at least a group of apertures of the plurality of apertures vary in at least one of: pitch, and diameter.

13. The halo of claim 12, wherein the group of apertures is located in a central area of the halo.

14. The halo of claim 11, wherein a first diameter of each of the plurality of apertures along the first side is larger than a second diameter of each of the plurality apertures along the second side.

15. The halo of claim 11, further comprising an aperture-free annular region encircling a central opening surrounding a platen supporting the semiconductor workpiece.

16. The halo of claim 11, wherein the thickness in a central area is less than the thickness proximate the first and second ends.

17. The halo of claim 11, wherein the thickness is uniform above an upper point of the central opening, and below a lower point of the central opening.

18. An apparatus comprising:
    a platen for supporting a workpiece; and
    a transparent halo surrounding the platen, the transparent halo comprising:
        a first side opposite a second side, and a first end opposite a second end,
        wherein the first side is arranged to receive an ion beam from an ion source; and
        a plurality of apertures extending through the first side and the second side, wherein the plurality of apertures permit passage of a just a portion of the ion beam to pass therethrough, and
        wherein the transparent halo has a varied conductance between the first and second ends by varying at least one of the following: a diameter of a group of apertures from the plurality of apertures, and a thickness of the transparent halo between the first side and the second side.

19. The apparatus of claim 18, the transparent halo further comprising an aperture-free annular region encircling a central opening surrounding the platen.

* * * * *